United States Patent
Aida et al.

(10) Patent No.: US 9,022,532 B1
(45) Date of Patent: May 5, 2015

(54) PIEZOELECTRIC ELEMENT, PIEZOELECTRIC ACTUATOR, PIEZOELECTRIC SENSOR, HARD DISK DRIVE, AND INK-JET PRINTER DEVICE

(71) Applicant: TDK Corporation, Tokyo (JP)

(72) Inventors: Yasuhiro Aida, Tokyo (JP); Ryu Ohta, Tokyo (JP); Yoshitomo Tanaka, Tokyo (JP); Hiroshi Chihara, Tokyo (JP); Hitoshi Sakuma, Tokyo (JP); Kazuhiko Maejima, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 14/058,912

(22) Filed: Oct. 21, 2013

(51) Int. Cl.
| | | |
|---|---|---|
| *B41J 2/045* | (2006.01) | |
| *H01L 41/08* | (2006.01) | |
| *H01L 41/187* | (2006.01) | |
| *G01L 1/16* | (2006.01) | |

(52) U.S. Cl.
CPC ........ *H01L 41/0805* (2013.01); *H01L 41/1873* (2013.01); *G01L 1/16* (2013.01); *B41J 2/045* (2013.01)

(58) Field of Classification Search
None
See application file for complete search history.

(56) References Cited

U.S. PATENT DOCUMENTS

| 7,048,360 B2 | 5/2006 | Kanno et al. | |
|---|---|---|---|
| 8,084,925 B2 | 12/2011 | Shibata et al. | |
| 2006/0183249 A1* | 8/2006 | Yao et al. | 438/3 |
| 2009/0236944 A1* | 9/2009 | Shibata et al. | 310/358 |

FOREIGN PATENT DOCUMENTS

| JP | A-2008-192868 | 8/2008 |
|---|---|---|
| JP | A-2009-295786 | 12/2009 |
| WO | WO 03/070641 A1 | 8/2003 |

OTHER PUBLICATIONS

"Processing of highly oriented (K,Na)NbO3 thin films using a tailored metal-alkoxide precurson solution" Y. Nakashima, W. Sakamoto, and T. Yogo 2011 J. Eur. Ceram. Soc. 31 2497.*

* cited by examiner

*Primary Examiner* — Erica Lin
(74) *Attorney, Agent, or Firm* — Oliff PLC

(57) ABSTRACT

The displacement as an actuator or the sensitivity as a sensor of a piezoelectric element can be increased and, in addition, the electric power consumption can be reduced by providing a thin film of potassium-sodium niobate, which is a perovskite type compound represented by a general formula $ABO_3$, as a piezoelectric layer, wherein a crystal orientation of a crystal structure of potassium-sodium niobate has in-plane fourfold symmetry as a whole piezoelectric layer, where a first axis of rotational symmetry is a thickness direction of the piezoelectric layer.

5 Claims, 8 Drawing Sheets

PIEZOELECTRIC ELEMENT, PIEZOELECTRIC ACTUATOR, PIEZOELECTRIC SENSOR, HARD DISK DRIVE, AND INK-JET PRINTER DEVICE

BACKGROUND OF INVENTION

1. Field of Invention

The present invention relates to a piezoelectric element by using a thin film piezoelectric material, a piezoelectric actuator and a piezoelectric sensor including the piezoelectric element, and a hard disk drive and an ink-jet printer device provided with the piezoelectric actuator.

2. Background Art

In recent years, there is an increasing demand for a piezoelectric material becoming lead-free and research on potassium-sodium niobate ((K,Na)NbO$_3$ (hereafter may be referred to as KNN) has become active. It is believed that a relatively high Curie temperature and good piezoelectric characteristics are obtained by KNN among lead-free piezoelectric materials and, therefore, KNN has been noted.

In addition, instead of bulk piezoelectric materials, commercialization of a piezoelectric element by using a thin film piezoelectric material has proceeded. Examples include piezoelectric sensors taking advantage of a piezoelectric effect, in which a force applied to a piezoelectric layer is converted to a voltage, e.g., a gyro sensor, a pressure sensor, a pulse wave sensor, a shock sensor, and a microphone, piezoelectric actuators taking advantage of an inverse piezoelectric effect, in which a piezoelectric layer is deformed when a voltage is applied to the piezoelectric layer, e.g., a hard disk drive head slider and an ink-jet print head, and a speaker, a buzzer, a resonator, and the like taking advantage of the inverse piezoelectric effect in the same manner.

In the case where a piezoelectric material is made into a thin film, miniaturization of an element becomes possible, applicable fields are expanded and, in addition, mass productivity increases because many elements can be produced on a substrate in one operation. Furthermore, there are many advantages in performances, for example, the sensitivity is improved in the case where a sensor is produced.

[PTL 1] Japanese Unexamined Patent Application Publication No. 2009-295786
[PTL 2] Japanese Unexamined Patent Application Publication No. 2008-192868
[PTL 3] WO 2003-070641

SUMMARY OF INVENTION

However, a piezoelectric layer made from KNN has a problem in that the piezoelectric constant is low and a large displacement is not obtained easily when a piezoelectric element is produced as compared with a piezoelectric layer by using a material containing lead.

If the piezoelectric constant is low, a high voltage is required to obtain a large displacement and a problem occurs in that dielectric breakdown is induced or the reliability during continuous operation is reduced.

It is stated that the technology described in PTL 1 can improve the piezoelectric constant by allowing the ratio of the out-of-plane lattice constant c of the KNN thin film to the in-plane lattice constant a to fall within a predetermined range. However, in this technology, the lattice constant is controlled by controlling the stress of the thin film. Therefore, the value is susceptible to the film formation condition and the film thickness, and the reproducibility is low.

It is stated that the technology described in PTL 2 can obtain good electrical characteristics (leakage characteristics and piezoelectric characteristics) by using at least one type of element selected from the group consisting of Pb, Ba, La, Sr, Bi, Li, Na, Ca, Cd, Mg, and K as the A site element and using at least one type of element selected from the group consisting of Ti, Zr, V, Nb, Ta, Cr, Mo, W, Mn, Sc, Co, Cu, In, Sn, Ga, Zn, Cd, Fe, Ni, and lanthanide elements as the B site element in perovskite type oxides, which include KNN and which are represented by ABO$_3$. However, in the case where a KNN thin film in which K and Na are employed as primary components of the A site and Nb is employed as a primary component of the B site is used as a piezoelectric element, sufficient electrical characteristics are not obtained even when the above-described other elements are added to the above-described sites.

It is stated that the technology described in PTL 3 can obtain good piezoelectric characteristics and leakage current characteristics by using Pb as a primary component of the A site, using Zr, Ti, and Pb as primary components of the B site, and further specifying the proportion of Pb atom relative to the total atoms in the B site to be 3% or more and 30% or less in a piezoelectric, which has a perovskite type crystal structure represented by ABO$_3$. However, the film formation condition to dispose Pb serving as a primary component in both the A and B sites is limited considerably, and the reproducibility and the mass productivity are poor. In addition, unfavorably, Pb is hazardous and, therefore, an environment suitable for the use is limited.

The present invention has been made in consideration of the problems included in the above-described related art and it is an object to provide a piezoelectric element including a KNN thin film and having a more improved piezoelectric constant.

The fact that a large displacement can be obtained refers to that a high piezoelectric constant is provided. Therefore, the element on the basis of a piezoelectric effect can be applied to the use of, for example, a sensor having high sensitivity and an element on the basis of an inverse piezoelectric effect can be applied to the use of, for example, an efficient actuator which can produce large vibration by a small voltage.

In order to achieve the above-described object, a piezoelectric element according to the present invention is a piezoelectric element including a thin film of potassium-sodium niobate, which is a perovskite type compound represented by a general formula ABO$_3$, as a piezoelectric layer, wherein a crystal orientation of a crystal structure of potassium-sodium niobate in the above-described piezoelectric layer has in-plane fourfold symmetry as a whole piezoelectric layer, where a first axis of rotational symmetry is a thickness direction of the above-described piezoelectric layer.

The crystal orientation of the crystal structure of the piezoelectric layer is allowed to have in-plane fourfold symmetry and, thereby, the piezoelectric constant of the piezoelectric layer is improved and, in particular, the displacement in the plane direction (31 direction) increases.

In the case where a voltage is applied in the thickness direction of the piezoelectric layer, the movement of a domain wall in addition to the lattice strain due to the piezoelectric effect distributes to the expansion and contraction behavior in the plane direction because the direction of the applied electric field and the polarization direction are not parallel. The direction of the domain walls can be aligned by allowing the crystal orientation of the crystal structure of the piezoelectric layer to have in-plane fourfold symmetry, and the displacement can be increased effectively as compared with a piezoelectric element including a piezoelectric layer having an in-plane asymmetric crystal structure.

In the piezoelectric layer of the piezoelectric element according to the present invention, preferably, there is a second axis of rotational symmetry, with respect to which the crystal orientation of the crystal structure of potassium-sodium niobate has fourfold symmetry and which is inclined from the above-described thickness direction, in addition to the above-described first axis of rotational symmetry. Consequently, the piezoelectric characteristics can be further enhanced.

The crystal orientation of the crystal structure with respect to the second axis of rotational symmetry, which is present while being inclined from the thickness direction of the piezoelectric layer, is present in addition to the crystal orientation of the crystal structure with respect to the first axis of rotational symmetry, which is the above-described thickness direction, so that the piezoelectric characteristics in a higher voltage region are enhanced. The reason for this is considered that the inclined 180° domain is present and, thereby, a rotatable domain remains when a high voltage is applied, and the region contributes to displacement.

Preferably, the piezoelectric layer of the piezoelectric element according to the present invention contains at least a tetragonal crystal. Consequently, temperature dependence of the piezoelectric characteristics can be reduced.

It is considered that in the case where an orthorhombic crystal is present in the piezoelectric layer, when heating is continued, transition to a tetragonal crystal occurs before the Curie point (cubic crystal phase transition temperature) is reached and, thereby, large temperature dependence is provided, although the influence is not exerted on a portion which is originally a tetragonal crystal.

A piezoelectric actuator according to the present invention includes the piezoelectric element represented by the above-described configuration. Specific examples of piezoelectric actuators include a head assembly of a hard disk drive and a piezoelectric actuator of an ink-jet printer head.

Meanwhile, a piezoelectric sensor according to the present invention includes the piezoelectric element represented by the above-described configuration. Specific piezoelectric sensors include a gyro sensor, a pressure sensor, and a pulse wave sensor.

In addition, in a hard disk drive and an ink-jet printer device according to the present invention, the above-described piezoelectric actuator is used.

The piezoelectric element according to the present invention can improve the piezoelectric characteristics as compared with the piezoelectric element including the conventional KNN thin film. Meanwhile, the piezoelectric actuator and the piezoelectric sensor according to the present invention can also improve the piezoelectric characteristics. Therefore, high-performance hard disk drive and ink-jet printer device can be provided.

DESCRIPTION OF PREFERRED EMBODIMENTS

Figure 1:
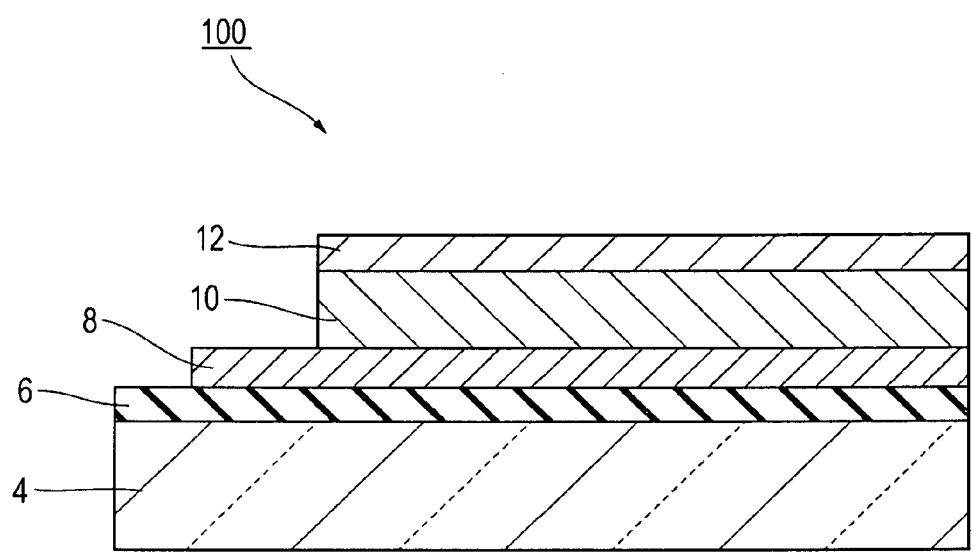
FIG. 1 is a configuration diagram of a piezoelectric element according to an embodiment of the present invention.

A preferred embodiment according to the present invention will be described below in detail with reference to the drawings. In this regard, in the drawings, the same or equivalent members are indicated by the same reference numerals. Meanwhile, vertical and horizontal relationships between positions are as shown in the drawing. And the same explanations will not be provided.

(Piezoelectric Element)

FIG. 1 shows a piezoelectric element 100 according to the present embodiment. The piezoelectric element 100 includes a substrate 4, an insulating layer 6 and a first electrode layer 8 disposed on the substrate 4, a piezoelectric layer 10 disposed on the first electrode layer 8, and a second electrode layer 12 disposed on the piezoelectric layer 10.

A silicon substrate exhibiting (100) face orientation can be used as the substrate 4. The substrate 4 has, for example, a thickness of 50 μm or more and 1,000 μm or less. In addition, a silicon substrate exhibiting face orientation different from a (100) face, a Silicon on Insulator (SOI) substrate, a quartz glass substrate, a compound semiconductor substrate made from, for example, GaAs, a sapphire substrate, a metal substrate made from, for example, stainless steel, a MgO substrate, a $SrTiO_3$ substrate, or the like can also be used as the substrate 4.

The insulating layer 6 is used in the case where the substrate 4 is electrically conductive. A silicon thermal oxidation film ($SiO_2$), $Si_3N_4$, $ZrO_2$, $Y_2O_3$, ZnO, $Al_2O_3$, or the like can be used as the insulating layer 6. In the case where the substrate 4 does not have electrical conductivity, the insulating layer 6 may not be provided. The insulating layer 6 can be formed by a sputtering method, a vacuum evaporation method, a thermal oxidation method, a printing method, a spin coating method, a sol-gel method, or the like.

The first electrode layer 8 is formed from, for example, Pt (platinum). The first electrode layer 8 has a thickness of, for example, 0.02 μm or more and 1.0 μm or less. The first electrode layer 8 is formed from Pt and, thereby, the piezoelectric layer 10 having high orientation property can be formed. Also, a metal material, e.g., Pd (palladium), Rh (rhodium), Au (gold), Ru (ruthenium), Ir (iridium), Mo (molybdenum), Ti (titanium), or Ta (tantalum), or an electrically conductive metal oxide, e.g., $SrRuO_3$ or $LaNiO_3$, can be used as the first electrode layer 8. The first electrode layer 8 can be formed by the sputtering method, the vacuum evaporation method, the printing method, the spin coating method, the sol-gel method, or the like.

In the first electrode layer 8, preferably, the (100) face or an orientation face parallel thereto, e.g., a (200) face or (400) face, has in-plane fourfold symmetry with respect to the thickness direction. The first electrode layer 8 having in-plane fourfold symmetry with respect to the thickness direction can be formed by, for example, the vacuum evaporation method.

The substrate temperature at this time is specified to be preferably 800° C. or higher and 1,000° C. or lower. Consequently, the first electrode layer 8 having higher orientation property can be formed.

As for the material used for the first piezoelectric layer 10, for example, a thin film of potassium-sodium niobate is used, which is a perovskite type compound and in which the crystal orientation of the crystal structure of the (001) face has in-plane fourfold symmetry, where the thickness direction is an axis of rotational symmetry.

The piezoelectric layer 10 is formed through film formation by the sputtering method, the vacuum evaporation method, the printing method, the spin coating method, the sol-gel method, or the like.

The crystal orientation of the crystal structure of the piezoelectric layer 10 is allowed to have in-plane fourfold symmetry and, thereby, the piezoelectric constant of the piezoelectric layer 10 is improved and, in particular, the displacement in the plane direction (31 direction) can be improved.

In the piezoelectric layer 10, preferably, there is a second axis of rotational symmetry, with respect to which the crystal orientation of the crystal structure of potassium-sodium niobate has fourfold symmetry and which is inclined from the above-described thickness direction, in addition to the above-described first axis of rotational symmetry in the thickness direction. Consequently, there is a tendency that the piezoelectric characteristics can be further enhanced.

Preferably, the piezoelectric layer 10 contains at least a tetragonal crystal. Consequently, there is a tendency that temperature dependence of the piezoelectric characteristics can be reduced.

Preferably, the first electrode layer 8 is subjected to reverse sputtering before film formation of the piezoelectric layer 10. Consequently, for example, there is a tendency that formation of the thin film of potassium-sodium niobate, which is a perovskite type compound and in which the crystal orientation of the crystal structure of the (001) face has in-plane fourfold symmetry with respect to the thickness direction can be facilitated, and there is a tendency that the piezoelectric characteristics of the piezoelectric element can be further enhanced.

Preferably, the piezoelectric layer 10 is formed in two steps. There is a tendency that, in the piezoelectric layer 10, the second axis of rotational symmetry, with respect to which the crystal orientation of the crystal structure of potassium-sodium niobate has fourfold symmetry and which is inclined from the thickness direction, can become present in addition to the above-described first axis of rotational symmetry in the above-described thickness direction by performing the formation in the first step at a temperature lower than the temperature in the second step and the piezoelectric characteristics can be further enhanced. The piezoelectric layer 10 may be formed in further more steps.

In the above-described method for forming the piezoelectric layer 10 in the two steps, the formation in the first step is performed within the range of preferably 200° C. to 500° C. Meanwhile, the formation in the first step is performed within the film thickness range of preferably 10 nm to 100 nm. There is a tendency that the piezoelectric characteristics of the piezoelectric element can be further enhanced by performing the first step within these temperature range and film thickness range.

The piezoelectric element 100 according to the present invention can contain at least one type of element selected from the group consisting of Li (lithium), Ba (barium), Sr (strontium), Ta (tantalum), Zr (zirconium), and Mn (manganese) in the piezoelectric layer 10. Consequently, there is a tendency that the piezoelectric characteristics of the element can be further enhanced.

The second electrode layer 12 is made from, for example, Pt. The second electrode layer 12 has a thickness of, for example, 0.02 μm or more and 1.0 μm or less. Alternatively, a metal material, e.g., Pd, Rh, Au, Ru, Ir, Mo, Ti, or Ta or an electrically conductive metal oxide, e.g., $SrRuO_3$ or $LaNiO_3$, can also be used as the second electrode layer 12. The second electrode layer 12 can be formed by the sputtering method, the vacuum evaporation method, the printing method, the spin coating method, the sol-gel method, or the like.

In this regard, the substrate 4 may be removed from the piezoelectric element 100. Consequently, the displacement and the sensitivity of the piezoelectric element can be increased.

Also, the piezoelectric element 100 may be coated with a protective layer. Consequently, the reliability can be enhanced.

In the piezoelectric element 100, an intermediate layer may be provided in any one of or both of between the first electrode layer 8 and the piezoelectric layer 10 and between the piezoelectric layer 10 and the second electrode layer 12.

As for this intermediate layer, an electrically conductive oxide is used. In particular, $SrRuO_3$, $SrTiO_3$, $LaNiO_3$, $CaRuO_3$, $BaRuO_3$, $(La_xSr_{1-x})CoO_3$, $YBa_2Cu_3O_7$, $La_4BaCu_5O_{13}$, and the like are preferable because the electrical conductivity is high and the heat resistance is provided.

(Piezoelectric Actuator)

Figure 2A:
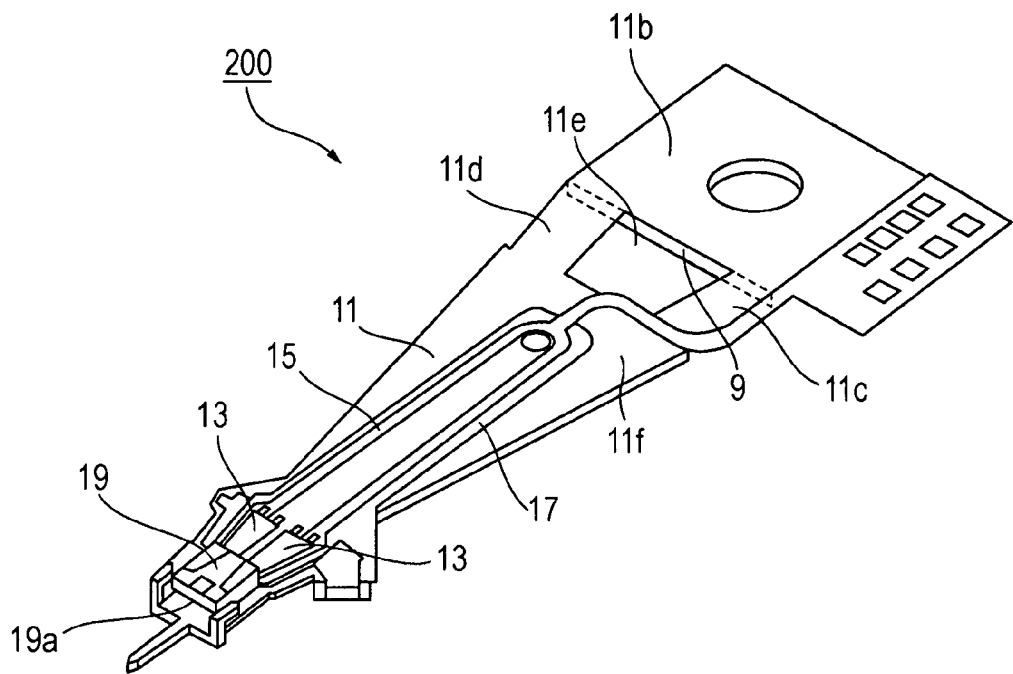
FIGS. 2A and 2B are structural diagrams of piezoelectric actuators according to the present invention.

FIG. 2A is a configuration diagram of a head assembly mounted on a hard disk drive (hereafter may be referred to as HDD) as an example of piezoelectric actuators including these piezoelectric elements. As shown in this drawing, a head assembly 200 includes a base plate 9, a load beam 11, a flexure 17, first and second piezoelectric elements 13 serving as driver elements, and a slider 19 provided with a head element 19a, as main constituents thereof.

In this regard, the load beam 11 includes a base end portion 11b fixed to the base plate 9 by beam welding or the like, first and second plate spring portions 11c and 11d extending from this base end portion 11b while tapering, an opening portion 11e disposed between the first and second plate spring portions 11c and 11d, and a beam main portion 11f following the first and second plate spring portions 11c and 11d and extending linearly while tapering.

The first and second piezoelectric elements 13 are disposed on a wiring flexible substrate 15 which is part of the flexure 17, while keeping a predetermined distance from each other. The slider 19 is fixed to an end portion of the flexure 17 and is rotated in accordance with expansion and contraction of the first and second piezoelectric elements 13.

The first and second piezoelectric elements 13 are formed from a first electrode layer, a second electrode layer, and a piezoelectric layer sandwiched between the first and second electrode layers. The electric power consumption can be reduced so as to enhance the reliability and a large displacement can be obtained by using the piezoelectric element exhibiting a large displacement as the piezoelectric element used for the piezoelectric actuator according to the present invention.

Figure 2B:
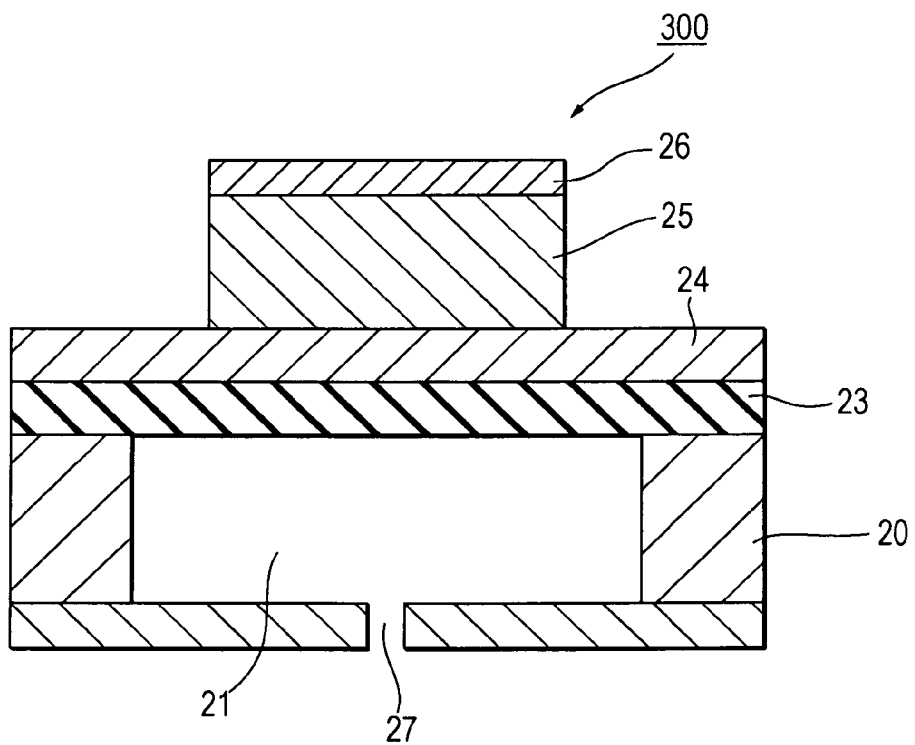

FIG. 2B is a configuration diagram of a piezoelectric actuator of an ink-jet printer head, as another example of the piezoelectric actuator including the above-described piezoelectric element.

A piezoelectric actuator 300 is formed by stacking an insulating layer 23, a lower electrode layer 24, a piezoelectric layer 25, and an upper electrode layer 26 on a substrate 20.

In the case where a predetermined ejection signal is not supplied and a voltage is not applied between the lower electrode layer 24 and the upper electrode layer 26, deformation does not occur in the piezoelectric layer 25. A pressure change does not occur in a pressure chamber 21 provided with a piezoelectric element supplied with no ejection signal, and an ink droplet is not ejected from a nozzle 27 thereof.

On the other hand, in the case where a predetermined ejection signal is supplied and a certain voltage is applied between the lower electrode layer 24 and the upper electrode layer 26, deformation occurs in the piezoelectric layer 25. The insulating film 23 is bent to a great extent in a pressure chamber 21 provided with the piezoelectric element supplied with an ejection signal. Consequently, the pressure in the pressure chamber 21 increases instantaneously, and an ink droplet is ejected from the nozzle 27.

Here, the electric power consumption can be reduced so as to enhance the reliability and a large displacement can be obtained by using the piezoelectric element exhibiting a large displacement as the piezoelectric element used for the piezoelectric actuator according to the present invention.

(Piezoelectric Sensor)

Figure 3A:
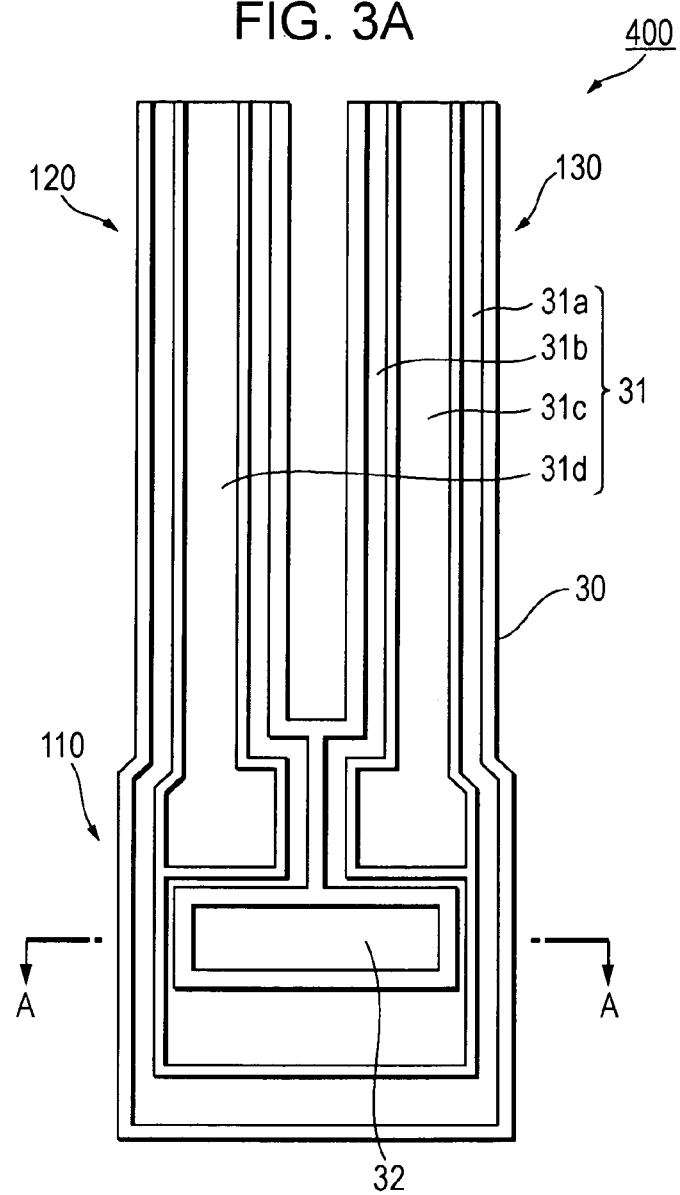
FIGS. 3A to 3D are structural diagrams of piezoelectric sensors according to the present invention.
Figure 3B:
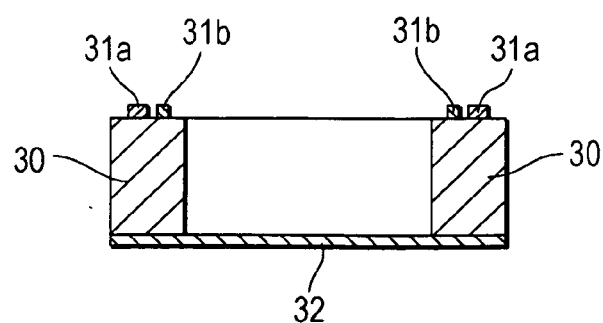

FIG. 3A is a configuration diagram (plan view) of a gyro sensor as an example of a piezoelectric sensor including the above-described piezoelectric element. FIG. 3B is a sectional view of the section taken along a line A-A shown in FIG. 3A.

A gyro sensor 400 is a tuning fork vibrator type angular velocity detecting element provided with a base portion 110 and two arms 120 and 130 connected to one surface of the base portion 110. This gyro sensor 400 is obtained by micromachining the piezoelectric layer 30, the upper electrode layer 31, and the lower electrode layer 32 constituting the above-described piezoelectric element to correspond with the shape of the tuning fork vibrator. The individual portions (base portion 110 and arms 120 and 130) are integrally formed by the piezoelectric element.

Each of drive electrode layers 31a and 31b and detection electrode layer 31d is disposed on a first principal surface of one arm 120. Likewise, each of drive electrode layers 31a and 31b and detection electrode layer 31c is disposed on a first principal surface of the other arm 130. Each of these electrode layers 31a, 31b, 31c, and 31d is obtained by etching the upper electrode layer 31 into a predetermined electrode shape.

Meanwhile, the lower electrode layer 32 disposed all over second principal surfaces (principal surface on the back side of the first principal surface) of the base portion 110 and the arms 120 and 130 functions as a ground electrode of the gyro sensor 400.

Here, the longitudinal direction of each of the arms 120 and 130 is specified to be a Z direction, and a plane including the principal surfaces of the two arms 120 and 130 is specified to be an XZ plane, so that an XYZ rectangular coordinate system is defined.

When a drive signal is supplied to the drive electrode layers 31a and 31b, the two arms 120 and 130 are excited in an in-plane vibration mode. The in-plane vibration mode refers to a vibration mode in which the two arms 120 and 130 are excited in a direction parallel to the principal surfaces of the two arms 120 and 130. For example, when one arm 120 is excited in a −X direction at a velocity V1, the other arm 130 is excited in a +X direction at a velocity V2.

In the case where rotation at an angular velocity ω is added to the gyro sensor 400 under this state while the axis of rotation is specified to be the Z axis, the Coriolis force is applied to each of the two arms 120 and 130 in a direction orthogonal to the direction of the vibration, and excitation occurs in an out-of-plane vibration mode. The out-of-plane vibration mode refers to a vibration mode in which the two arms 120 and 130 are excited in a direction orthogonal to the principal surfaces of the two arms 120 and 130. For example, when the Coriolis force F1 applied to one arm 120 is in a −Y direction, a Coriolis force F2 applied to the other arm 130 is in a +Y direction.

The magnitudes of the Coriolis forces F1 and F2 are proportionate to the angular velocity ω and, therefore, the angular velocity ω can be determined by converting mechanical strains of the arms 120 and 130 due to the Coriolis forces F1 and F2 to electric signals (detection signals) by the piezoelectric layer 30 and taking them from the detection electrode layers 31c and 31d.

The electric power consumption can be reduced so that high reliability and sufficient detection sensitivity can be obtained by using the piezoelectric element exhibiting a large displacement as the piezoelectric element used for the piezoelectric sensor according to the present invention.

Figure 3C:
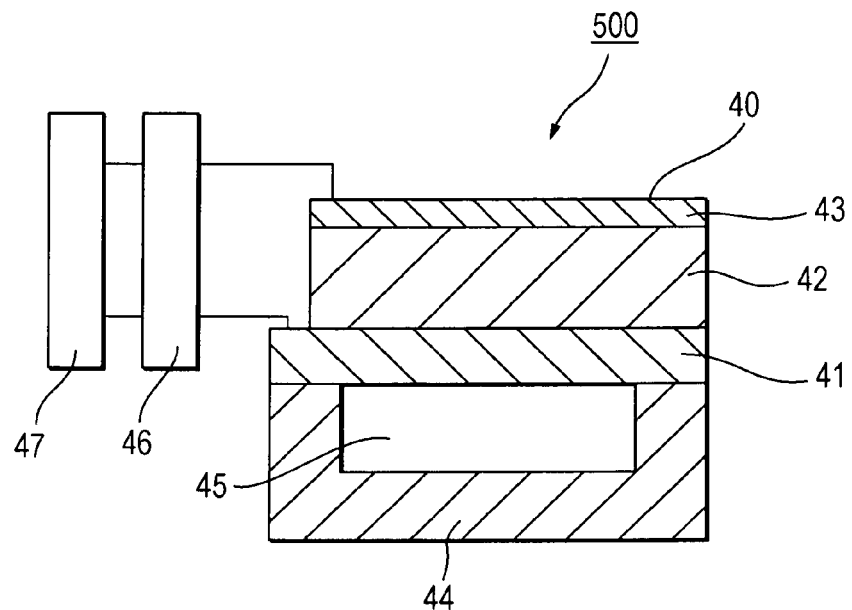

FIG. 3C is a configuration diagram of a pressure sensor as a second example of the piezoelectric sensor including the above-described piezoelectric element.

A pressure sensor 500 has a cavity 45 to respond to application of a pressure and, in addition, is formed from a support member 44 to support a piezoelectric element 40, a current amplifier 46, and a voltage measuring instrument 47. The piezoelectric element 40 includes a common electrode layer 41, a piezoelectric layer 42, and an individual electrode layer 43, which are stacked in that order on the support member 44. Here, when an external force is applied, the piezoelectric element 40 is bent and the voltage is detected by the voltage measuring instrument 47.

High withstand voltage and sufficient detection sensitivity can be obtained by using the piezoelectric element exhibiting a large displacement as the piezoelectric element used for the piezoelectric sensor according to the present invention.

Figure 3D:
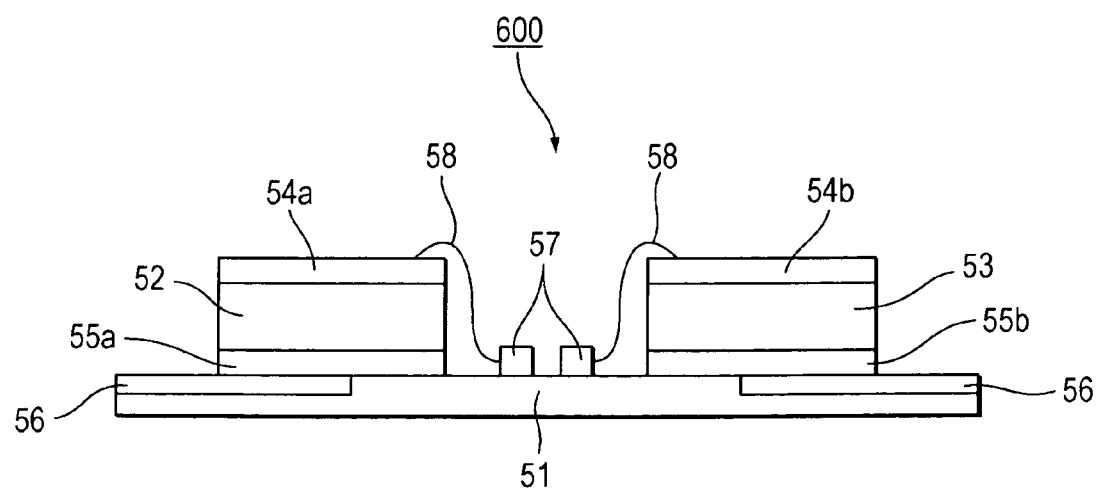

FIG. 3D is a configuration diagram of a pulse wave sensor as a third example of the piezoelectric sensor including the above-described piezoelectric element.

A pulse wave sensor 600 is configured to be equipped with a transmitting piezoelectric element and a receiving piezoelectric element on a substrate 51. Here, in the transmitting piezoelectric element, electrode layers 54a and 55a are disposed on the two surfaces of the transmitting piezoelectric layer 52 in the thickness direction, and in the receiving piezoelectric element, electrode layers 54b and 55b are also disposed on the two surfaces of the receiving piezoelectric layer 53 in the thickness direction. In addition, electrodes 56 and upper surface electrodes 57 are disposed on the substrate 51, where the electrode layers 54a and 54b are electrically connected to the upper surface electrodes 57, respectively, by wirings 58.

In order to detect pulses of a living body, initially, the substrate back surface (surface not equipped with the piezoelectric element) of the pulse wave sensor 600 is brought into contact with the living body. Then, when pulses are detected, a specific drive voltage signal is output to both the electrode layers 54a and 55a of the transmitting piezoelectric element. The transmitting piezoelectric element is excited in accordance with the drive voltage signal input into both the electrode layers 54a and 55a, so as to generate an ultrasonic wave and transmit the ultrasonic wave into the living body. The ultrasonic wave transmitted into the living body is reflected by a bloodstream and is received by the receiving piezoelectric element. The receiving piezoelectric element converts the received ultrasonic wave to a voltage signal and outputs from both the electrode layers 54b and 55b.

The electric power consumption can be reduced and high reliability and sufficient detection sensitivity can be obtained by using the piezoelectric element exhibiting a large displacement as the piezoelectric element used for the piezoelectric sensor according to the present invention.

(Hard Disk Drive)

Figure 4:
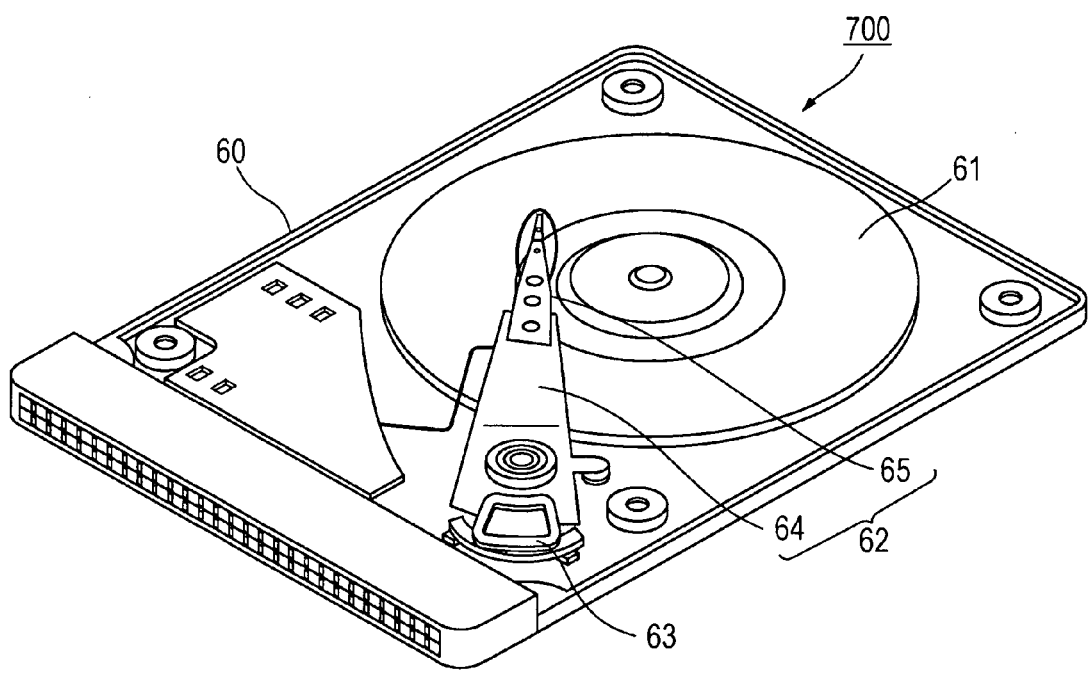
FIG. 4 is a structural diagram of a hard disk drive according to the present invention.

FIG. 4 is a configuration diagram of a hard disk drive equipped with the head assembly shown in FIG. 2A.

A hard disk drive 700 is provided with a hard disk 61 serving as a recording medium and a head stack assembly 62 to record the magnetic information thereto and regenerate in a housing 60. The hard disk 61 is rotated by a motor, although not shown in the drawing.

In the head stack assembly 62, a plurality of assemblies formed from an actuator arm 64 supported by a voice coil motor 63 in such a way as to rotate freely around a spindle and a head assembly 65 connected to this actuator arm 64 are stacked in the depth direction in the drawing. The head slider 19 is attached to an end portion of the head assembly 65 in such a way as to opposite to the hard disk 61 (refer to FIG. 2A).

As for the head assembly 65 (200), a form in which the head element 19a (refer to FIG. 2A) is fluctuated in two steps is adopted. Relatively large movements of the head element 19a are controlled by whole drive of the head assembly 65 and the actuator arm 64 on the basis of the voice coil motor 63, and fine movements are controlled by drive of the head slider 19 by the end portion of the head assembly 65.

The electric power consumption can be reduced and high reliability and sufficient accessibility can be obtained by using the piezoelectric element exhibiting a large displacement as the piezoelectric element used for this head assembly 65.

(Ink Jet Printer Device)

Figure 5:
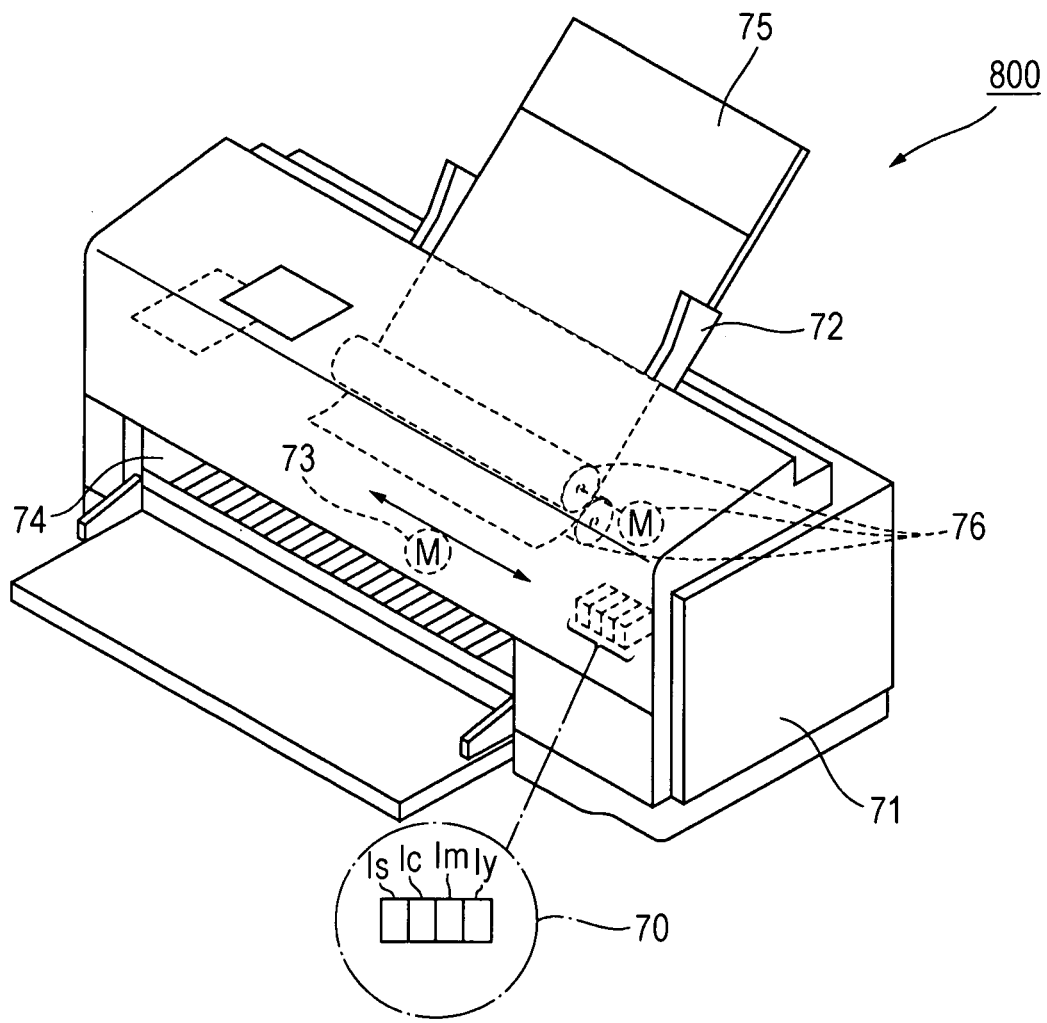
FIG. 5 is a structural diagram of an ink-jet printer device according to the present invention.

FIG. 5 is a configuration diagram of an ink-jet printer device equipped with the ink-jet printer head shown in FIG. 2B.

An ink-jet printer device 800 is configured to primarily include an ink-jet printer head 70, a main body 71, a tray 72, and a head drive mechanism 73. The piezoelectric actuator 300 is included in the ink-jet printer head 70.

The ink-jet printer device 800 is provided with ink cartridges of four colors of yellow, magenta, cyan, and black in total and is configured to be able to perform full color printing. In addition, this ink-jet printer device 800 is provided with a dedicated controller board and the like in the inside, and the ink ejection timing of the ink-jet printer head 70 and scanning of the head drive mechanism 73 are controlled. Meanwhile, the main body 71 is provided with the tray 72 on the back and is provided with an automatic sheet feeder (automatic continuous sheet feeding mechanism) 76 in the inside, so as to automatically send recording paper 75 and deliver the recording paper 75 from a front-mounted delivery port 74.

The electric power consumption can be reduced and an ink-jet printer device exhibiting high reliability and high safety can be provided by using the piezoelectric element exhibiting a large displacement as the piezoelectric element used for the piezoelectric actuator of this ink-jet printer head 70.

For example, the piezoelectric element according to the present invention can be used for applications, e.g., a gyro sensor, a shock sensor, and a microphone, taking advantage of a piezoelectric effect and applications, e.g., an actuator, an ink-jet head, a speaker, a buzzer, and a resonator, taking advantage of an inverse piezoelectric effect, and is particularly suitable for applications taking advantage of the inverse piezoelectric effect.

EXAMPLES

The present invention will be more specifically described below with reference to the examples and the comparative examples. However, the present invention is not limited to the following examples.

Production of Piezoelectric Element

Example 1

In the example, a term "base member" refers to a member to be provided with a film in each step.

A silicon wafer (substrate 4) which was provided with a thermal oxidation film ($SiO_2$: insulating layer 6) and which had a diameter of 3 inches and a thickness of 400 μm was placed as a base member in a vacuum chamber of a RF sputtering apparatus, evacuation was performed and, thereafter, a film of Pt was formed as a first electrode layer 8. The base member temperature in film formation was specified to be 400° C. and the thickness of the first electrode layer 8 was specified to be 200 nm.

After the first electrode 8 was formed, an out-of-plane XRD (X-ray diffraction) measurement was performed to examine the orientation property in a direction perpendicular to the plane and an in-plane XRD measurement was performed to examine the orientation property in the in-plane direction. Examples of other methods for examining the orientation property in the in-plane direction include a method in which a sample cut in the plane (in-plane) direction with a TEM (transmission electron microscope) is subjected to electron beam diffraction.

The out-of-plane XRD measurement is divided into a symmetric reflection measurement ($2\theta/\theta$ measurement) in which a lattice plane parallel to the sample surface is measured and an asymmetric reflection measurement in which a lattice plane obliquely intersecting the sample surface is measured. In the present invention, the $2\theta/\theta$ measurement was performed.

The in-plane XRD measurement is a technique to allow the incident x rays to graze the surface of the thin film sample and measure diffraction from the lattice plane orthogonal to the surface in the thin film. In the present example, an in-plane axis was fixed to a plane obtained by the out-of-plane XRD measurement performed in advance and a measurement called a twist measurement was performed. The twist measurement is a technique to evaluate the in-plane symmetric property of the substrate in a specific plane.

The in-plane axis was fixed to the Pt (111) face obtained by the out-of-plane XRD measurement and the twist measurement was performed. As a result, a clear peak was not obtained and it was ascertained that the Pt (111) face was in-plane asymmetry.

Subsequently, the base member was transferred to a chamber of a RF sputtering apparatus equipped with a sputtering target, evacuation was performed and, thereafter, the base member was subjected to reverse sputtering. As for an atmosphere gas in the reverse sputtering, 50 sccm of Ar (argon) was supplied to the inside of a chamber, and an electric power of 500 W was put in under a pressure of 1 Pa for 30 seconds to perform a treatment.

A $(K_{0.5}Na_{0.5})NbO_3$ thin film was formed as a piezoelectric layer 10 on the base member following the reverse sputtering. As for a sputtering target, a $(K_{0.5}Na_{0.5})NbO_3$ sintered material was used. The base member temperature in film formation was specified to be 600° C. and the thickness of the piezoelectric layer 10 was specified to be 2,000 nm.

After the piezoelectric layer 10 was formed, an out-of-plane XRD measurement was performed to examine the orientation property in a direction perpendicular to the plane and an in-plane XRD measurement was performed to examine the orientation property in the in-plane direction.

In the present example, piezoelectric layer 10 was further subjected to a pole measurement. The pole figure obtained from the pole measurement is a diagram indicating what orientation does a certain crystal face have in the sample and is a diagram in which distribution of an azimuth concerned (this is referred to as pole) is plotted with respect to intensity in a polar stereographic projection drawing. That is, the information on the manner of orientation of the crystal face concerned relative to the sample surface can be obtained by looking at the pole figure.

The in-plane axis was fixed to the KNN (001) face obtained by the out-of-plane XRD measurement and the twist measurement was performed. As a result, it was ascertained that the KNN (001) face had in-plane fourfold symmetry because a clear peak appeared about every 90°.

It was ascertained from the pole figure obtained by pole measurement of the KNN (001) face that the axis of rotational symmetry is not inclined relative to the thickness direction of the piezoelectric film.

It was ascertained from the lattice constant of the piezoelectric layer 10 obtained by the above-described out-of-plane XRD measurement and in-plane XRD measurement that the piezoelectric layer 10 was an orthorhombic crystal.

From the results of the above-described in-plane XRD measurement, it is believed that in the piezoelectric layer 10 of the present example, two types of crystal structures are present in the plane while parallel c axes are displaced 90° with respect to each other.

Thereafter, the base member was transferred again to another chamber of the RF sputtering apparatus, evacuation was performed and, then, a film of Pt was formed as a second electrode layer 12. The base member temperature in film formation was specified to be 200° C. and the thickness of the second electrode layer 12 was specified to be 200 nm.

After the second electrode layer 12 was formed, a laminate including the piezoelectric layer 10 was patterned by photolithography and dry etching, wet etching, and the wafer was subjected to cutting work, so as to obtain a piezoelectric element 100 having a movable part dimension of 5 mm×20 mm.

Comparative Example 1

In the piezoelectric element production step in Example 1, reverse sputtering before film formation of the piezoelectric layer 10 was not performed. A piezoelectric element of Comparative example 1 was produced, where other element configurations and the production steps were the same as those in Example 1.

After the piezoelectric layer 10 was formed, the out-of-plane XRD measurement was performed to examine the orientation property in a direction perpendicular to the plane and the in-plane XRD measurement was performed to examine the orientation property in the in-plane direction.

Figure 6:
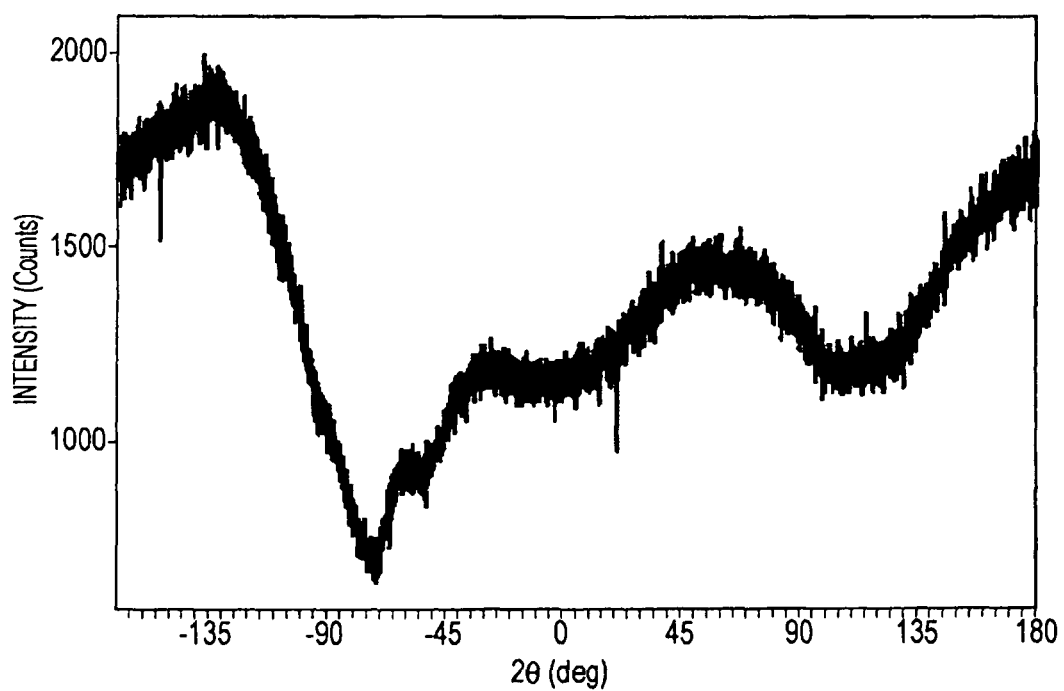
FIG. 6 is a diagram of a diffraction pattern showing the in-plain orientation property obtained by an XRD measurement of a piezoelectric layer in a conventional piezoelectric element.

The in-plane axis was fixed to the KNN (001) face obtained by the out-of-plane XRD measurement and the twist measurement was performed. As a result, a clear peak was not obtained and it was ascertained that the KNN (001) face was in-plane asymmetry. FIG. 6 shows the result of the twist measurement.

It was ascertained from the pole figure obtained by the pole measurement of the KNN (001) face that the axis of rotational symmetry was not inclined relative to the thickness direction of the piezoelectric film.

It was ascertained from the lattice constant of the piezoelectric layer 10 obtained by the above-described out-of-plane XRD measurement and in-plane XRD measurement that the piezoelectric layer 10 was an orthorhombic crystal.

Example 2

The piezoelectric layer 10 film formation step following the reverse sputtering in Example 1 was performed in two steps. The base material temperature during film formation in the first step was specified to be 450° C. and the thickness was specified to be 50 nm. Successively, the same chamber was employed, the base material temperature in the second step was specified to be 600° C., and the thickness was specified to be 1,950 nm. A $(K_{0.5}Na_{0.5})NbO_3$ thin film having a thickness of 2,000 nm in total was formed as the piezoelectric layer 10 by the above-described two-step film formation. A piezoelectric element of Example 2 was produced as with Example 1 except the element configuration and the production steps described above.

After the piezoelectric layer 10 was formed, the out-of-plane XRD measurement was performed to examine the orientation property in a direction perpendicular to the plane and the in-plane XRD measurement was performed to examine the orientation property in the in-plane direction.

The in-plane axis was fixed to the KNN (001) face obtained by the out-of-plane XRD measurement and the twist measurement was performed. As a result, it was ascertained that the KNN (001) face had in-plane fourfold symmetry because a clear peak appeared about every 90°.

It was ascertained from the pole figure obtained by the pole measurement of the KNN (001) face that the axis of rotational symmetry inclined relative to the thickness direction of the piezoelectric film was present in addition to the axis of rotational symmetry in the thickness direction of the piezoelectric film.

It was ascertained from the lattice constant of the piezoelectric layer 10 obtained by the above-described out-of-plane XRD measurement and in-plane XRD measurement that an orthorhombic crystal and a tetragonal crystal were present together in the piezoelectric layer 10.

From the results of the above-described in-plane XRD measurement, it is believed that in the piezoelectric layer 10 of the present example as well, two types of crystal structures are present in the plane while parallel c axes are displaced 90° with respect to each other.

Example 3

The piezoelectric layer 10 film formation step following the reverse sputtering in Example 1 was performed in two steps. The base material temperature during film formation in the first step was specified to be 450° C. and the thickness was specified to be 50 nm. Successively, the same chamber was employed, and the base member was subjected to reverse sputtering. As for an atmosphere gas in the reverse sputtering, 50 sccm of Ar (argon) was supplied to the inside of a chamber, and an electric power of 1,000 W was put in under a pressure of 1 Pa for 15 seconds to perform a treatment. Thereafter, the film formation in the second step was performed. The base material temperature during the film formation in the second step was specified to be 600° C. and the thickness was specified to be 1,950 nm. A $(K_{0.5}Na_{0.5})NbO_3$ thin film having a thickness of 2,000 nm in total was formed as the piezoelectric layer 10 by the above-described two-step film formation sandwiching the reverse sputtering. A piezoelectric element of Example 3 was produced as with Example 1 except the element configuration and the production steps described above.

After the piezoelectric layer 10 was formed, the out-of-plane XRD measurement was performed to examine the orientation property in a direction perpendicular to the plane and the in-plane XRD measurement was performed to examine the orientation property in the in-plane direction.

The in-plane axis was fixed to the KNN (001) face obtained by the out-of-plane XRD measurement and the twist measurement was performed. As a result, it was ascertained that the KNN (001) face had in-plane fourfold symmetry because a clear peak appeared every 90°.

It was ascertained from the pole figure obtained by the pole measurement of the KNN (001) face that the axis of rotational symmetry inclined relative to the thickness direction of the piezoelectric film was present in addition to the axis of rotational symmetry in the thickness direction of the piezoelectric film.

It was ascertained from the lattice constant of the piezoelectric layer 10 obtained by the above-described out-of-plane XRD measurement and in-plane XRD measurement that the piezoelectric layer 10 was a tetragonal crystal.

From the results of the in-plane XRD measurement, it is believed that in the piezoelectric layer 10 of the present example, the a axis or the b axis of the tetragonal crystal is parallel to the film thickness direction of the piezoelectric film and two types of crystal structures are present in the plane while parallel c axes are displaced 90° with respect to each other.

Example 4

A silicon wafer (substrate 4) which was provided with a thermal oxidation film ($SiO_2$: insulating layer 6) and which had a diameter of 3 inches and a thickness of 400 μm was placed as a base substrate in a vacuum chamber of an electron beam evaporation apparatus, evacuation was performed and, thereafter, a film of Pt was formed as a first electrode layer 8 by an electron beam evaporation method. The base member temperature during film formation was specified to be 800° C. and the thickness of the first electrode layer 8 was specified to be 200 nm. A piezoelectric element of Example 4 was produced as with Example 3 except the element configuration and the production steps described above.

After the first electrode layer 8 was formed, the out-of-plane XRD measurement was performed to examine the orientation property in a direction perpendicular to the plane and the in-plane XRD measurement was performed to examine the orientation property in the in-plane direction.

The in-plane axis was fixed to the Pt(200) face obtained by the out-of-plane XRD measurement and the twist measurement was performed. As a result, it was ascertained that the Pt(200) face had in-plane fourfold symmetry because a clear peak appeared every 90°.

After the piezoelectric layer 10 was formed, the out-of-plane XRD measurement was performed to examine the orientation property in a direction perpendicular to the plane and the in-plane XRD measurement was performed to examine the orientation property in the in-plane direction.

Figure 7:
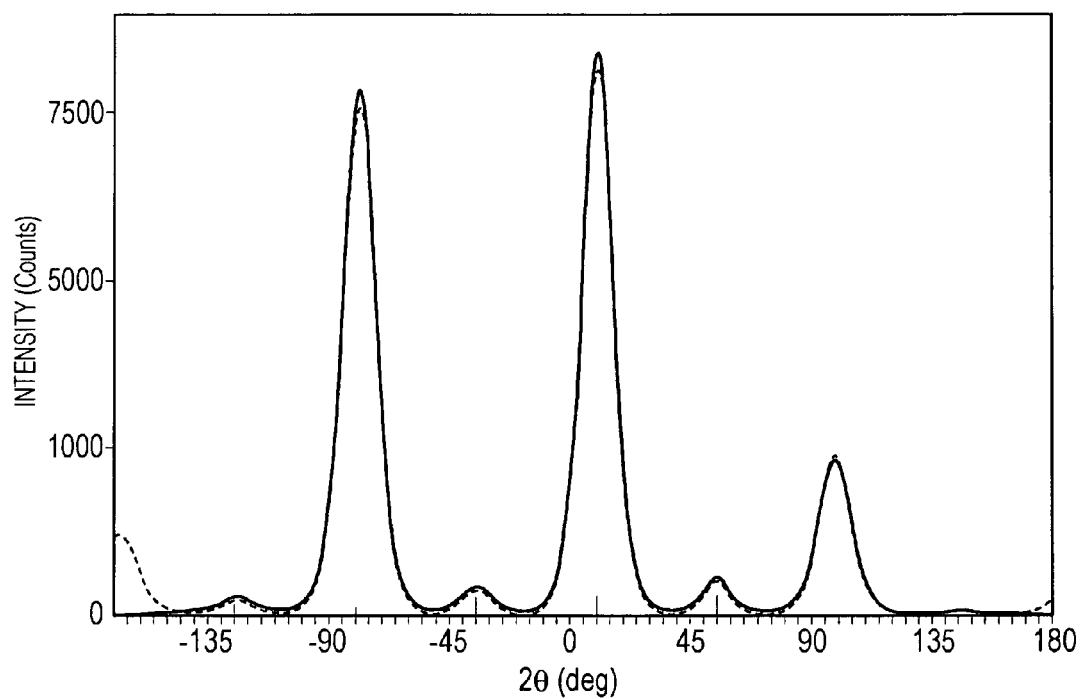
FIG. 7 is a diagram of a diffraction pattern showing the in-plain orientation property obtained by an XRD measurement of a piezoelectric layer in a piezoelectric element according to the present invention.

The in-plane axis was fixed to the KNN (001) face obtained by the out-of-plane XRD measurement and the twist measurement was performed. As a result, it was ascertained that the KNN (001) face had in-plane fourfold symmetry because a clear peak appeared every 90°. FIG. 7 shows the result of the twist measurement.

It was ascertained from the pole figure obtained by the pole measurement of the KNN (001) face that the axis of rotational symmetry inclined relative to the thickness direction of the piezoelectric film was present in addition to the axis of rotational symmetry in the thickness direction of the piezoelectric film.

It was ascertained from the lattice constant of the piezoelectric layer 10 obtained by the above-described out-of-plane XRD measurement and in-plane XRD measurement that the piezoelectric layer 10 was a tetragonal crystal.

From the results of the in-plane XRD measurement, it is believed that the piezoelectric layer 10 of the present example is formed from a crystal structure in which the c axis of the tetragonal crystal is parallel to the film thickness direction of the piezoelectric film.

The element configuration, the production steps, and the crystal system of the piezoelectric layer in each of the examples and the comparative examples are shown in Table 1.

(Evaluation of Piezoelectric Element)

The displacement when a voltage was applied to each of piezoelectric elements of Examples 1 to 4 and Comparative example 1 was measured by using a laser Doppler vibrograph (produced by Graphtec Corporation). Table 1 shows the values of displacements measured by applying a voltage of sinusoidal wave (±20V) with a frequency of 1 kHz, where the first electrode layer was connected to a positive electrode and the second electrode layer was connected to a negative electrode.

It was ascertained that the displacement of the piezoelectric element of each of Examples 1 to 4, which was a piezoelectric element provided with a thin film of potassium-sodium niobate, i.e. a perovskite type compound represented by a general formula $ABO_3$, as a piezoelectric layer, wherein the crystal orientation of the crystal structure of potassium-sodium niobate in the above-described piezoelectric layer had in-plane fourfold symmetry as a whole piezoelectric layer, where a first axis of rotational symmetry was the thickness direction of the above-described piezoelectric layer, was larger than the displacement of the piezoelectric element of Comparative example 1 not satisfying the above-described requirements.

It was ascertained that the displacement of the piezoelectric element of each of Examples 2 to 4 having a second axis of rotational symmetry, with respect to which the crystal orientation of the crystal structure of potassium-sodium niobate had fourfold symmetry and which was inclined from the above-described thickness direction, in addition to the above-described first axis of rotational symmetry and including a potassium-sodium niobate thin film, which contains at least a tetragonal crystal, as a piezoelectric layer was larger than the displacements of the piezoelectric elements of Comparative example 1 and Example 1 not satisfying the above-described requirements.

Furthermore, it was ascertained that the displacement of the piezoelectric element of each of Examples 3 and 4 including a potassium-sodium niobate thin film, which was a tetragonal crystal, as a piezoelectric layer was larger than the displacements of the piezoelectric elements of Comparative example 1 and Examples 1 and 2 not satisfying the above-described requirements.

It was ascertained that the displacement of the piezoelectric element of Example 4, in which the Pt(200) face of the first electrode layer 8 had in-plane fourfold symmetry with respect to the axis in the thickness direction, was larger than the displacements of the piezoelectric elements of Comparative example 1 and Examples 1 to 3 not satisfying the above-described requirements.

In the above-described examples, the ratio of K to Na, which were primary components of the A site, was specified to be 1, that is, x in $K_{1-x}Na_x$ was specified to be 0.5. However, the effect of the present invention does not change in compositions in which x is other than 0.5. Meanwhile, in the above-described examples, an additive was not added. However, the effect of the present invention does not change when Sr, Mn, Zr, Li, Ba, and Ta are added.

The piezoelectric element according to the present invention is provided with a piezoelectric layer having a predetermined crystal structure. Therefore, the electric power consumption can be reduced so as to enhance the reliability and a large displacement can be obtained by using the piezoelectric element exhibiting a large displacement as the piezoelectric layer of the piezoelectric actuator.

The electric power consumption can be reduced and the high reliability and sufficient detection sensitivity can be obtained by using the piezoelectric element exhibiting a large displacement as the piezoelectric layer of the piezoelectric sensor.

The electric power consumption can be reduced and high reliability and sufficient accessibility can be obtained by using the piezoelectric element exhibiting a large displacement as the piezoelectric element used for the head assembly of the hard disk drive.

In addition, the electric power consumption can be reduced and an ink-jet printer device exhibiting high reliability and high safety can be provided by using the piezoelectric element exhibiting a large displacement as the piezoelectric element used for the piezoelectric actuator of the ink-jet printer head.

TABLE 1

| | Insulating layer/ substrate | First electrode layer Pt film formation method | Piezoelectric layer film formation first step | | Piezoelectric layer film formation second step | | | |
|---|---|---|---|---|---|---|---|---|
| | | | Reverse sputtering before KNN | film thickness/ film formation temperature | Reverse sputtering before second step | film thickness/ film formation temperature | KNN crystal system | Displacement (μm) |
| Comparative example 1 | $SiO_2$/Si | sputtering | none | 2000 nm/600° C. | — | — | orthorhombic crystal | 0.30 |
| Example 1 | $SiO_2$/Si | sputtering | 500 W/30 sec | 2000 nm/600° C. | — | — | orthorhombic crystal | 1.09 |

TABLE 1-continued

| | | First electrode layer | Piezoelectric layer film formation first step | | Piezoelectric layer film formation second step | | | |
|---|---|---|---|---|---|---|---|---|
| | Insulating layer/ substrate | Pt film formation method | Reverse sputtering before KNN | film thickness/ film formation temperature | Reverse sputtering before second step | film thickness/ film formation temperature | KNN crystal system | Displacement ($\mu$m) |
| Example 2 | SiO$_2$/Si | sputtering | 500 W/30 sec | 50 nm/450° C. | none | 1950 nm/600° C. | orthorohmbic crystal•tetragonal crystal | 1.40 |
| Example 3 | SiO$_2$/Si | sputtering | 500 W/30 sec | 50 nm/450° C. | 1000 W/15 sec | 1950 nm/600° C. | tetragonal crystal | 1.90 |
| Example 4 | SiO$_2$/Si | evaporation | 500 W/30 sec | 50 nm/450° C. | 1000 W/15 sec | 1950 nm/600° C. | tetragonal crystal | 2.53 |

The invention claimed is:

1. A piezoelectric element characterized by comprising a thin film of potassium-sodium niobate, which is a perovskite type compound represented by a general formula ABO3, as a piezoelectric layer, wherein a crystal orientation of a crystal structure of potassium-sodium niobate in the piezoelectric layer has in-plane fourfold symmetry as a whole piezoelectric layer, where a first axis of rotational symmetry is a thickness direction of the piezoelectric layer, and the thin film of potassium-sodium niobate contains at least a tetragonal crystal, wherein in the piezoelectric layer, there is a second axis of rotational symmetry, with respect to which the crystal orientation of the crystal structure of potassium-sodium niobate has fourfold symmetry and which is inclined from the thickness direction, in addition to the first axis of rotational symmetry.

2. A piezoelectric actuator comprising the piezoelectric element according to claim 1.

3. A piezoelectric sensor comprising the piezoelectric element according to claim 1.

4. A hard disk drive comprising the piezoelectric actuator according to claim 2.

5. An ink-jet printer device comprising the piezoelectric actuator according to claim 2.

* * * * *